United States Patent
Fujiki et al.

(10) Patent No.: US 6,586,838 B2
(45) Date of Patent: Jul. 1, 2003

(54) SEMICONDUCTOR DEVICE

(75) Inventors: Noriaki Fujiki, Tokyo (JP); Takeru Matsuoka, Tokyo (JP); Hiroki Takewaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/909,781

(22) Filed: Jul. 23, 2001

(65) Prior Publication Data

US 2002/0117755 A1 Aug. 29, 2002

(30) Foreign Application Priority Data

Feb. 26, 2001 (JP) ........................................ 2001-051172

(51) Int. Cl.[7] ...................... H01L 23/48; H01L 23/52; H01L 29/40
(52) U.S. Cl. .................. 257/758; 257/760; 257/768; 257/756; 257/757
(58) Field of Search ................................ 257/758, 761, 257/765, 756, 757, 768

(56) References Cited

U.S. PATENT DOCUMENTS

| | | | | |
|---|---|---|---|---|
| 4,419,809 A | * | 12/1983 | Riseman et al. | 438/231 |
| 5,202,275 A | * | 4/1993 | Sugiura et al. | 438/210 |
| 5,420,075 A | * | 5/1995 | Homma et al. | 438/624 |
| 5,753,564 A | * | 5/1998 | Fukada | 438/624 |
| 5,850,102 A | * | 12/1998 | Matsuno | 257/635 |
| 6,057,242 A | * | 5/2000 | Kishimoto | 438/692 |
| 6,149,986 A | * | 11/2000 | Shibata et al. | 427/571 |
| 6,184,143 B1 | * | 2/2001 | Ohashi et al. | 438/697 |
| 6,211,570 B1 | * | 4/2001 | Kakamu | 257/760 |
| 6,313,003 B1 | * | 11/2001 | Chen | 438/396 |

FOREIGN PATENT DOCUMENTS

| | | | |
|---|---|---|---|
| JP | 03120744 A | * | 5/1991 |
| JP | 07-029905 | | 1/1995 |
| JP | 10-098102 | | 4/1998 |
| JP | 10-270554 | | 10/1998 |
| JP | 10-335461 | | 12/1998 |
| JP | 11-317454 | | 11/1999 |
| JP | 2000-174119 | | 6/2000 |

* cited by examiner

Primary Examiner—Eddie Lee
Assistant Examiner—Chris C. Chu
(74) Attorney, Agent, or Firm—McDermott, Will & Emery (57) ABSTRACT

To provide excellent reliability and high yield of a semiconductor device that has a multi-wiring structure by using a fluorine-containing silicon oxide film as an interlayer insulating film. A fluorine-containing silicon oxide film is formed so as to cover a lower layer metal wiring. A TEOS film is formed on the fluorine-containing silicon oxide film. After planarizing the TEOS film with the CMP method, an $SiH_4$-based silicon oxide film that is suitable for capturing fluorine is formed on the TEOS film. Metal wirings are formed on the $SiH_4$-based silicon oxide film. A predetermined heat treatment is performed to capture fluorine inside the $SiH_4$-based silicon oxide film. The $SiH_4$-based silicon oxide film is patterned to the same pattern as the metal wirings. After diffusing fluorine into the atmosphere from the exposed area of the TEOS film, a silicon nitride film is formed on the metal wirings.

5 Claims, 5 Drawing Sheets

SEMICONDUCTOR DEVICE

BACKGROUND OF THE INVENTION

1. Field of the Invention

The present invention relates to a semiconductor device, and more specifically, to a semiconductor device having a structure suitable for imparting high reliability to semiconductors with a multi-layer wiring structure.

2. Description of the Background Art

Figure 1:
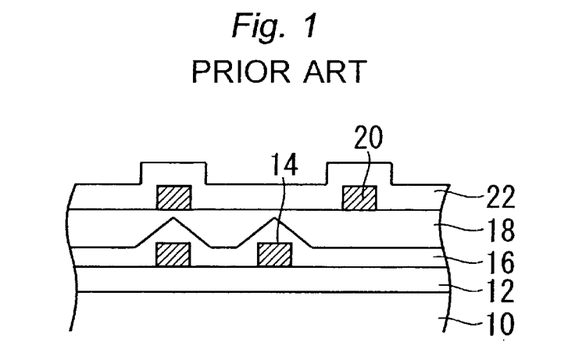
FIG. 1 is a cross-sectional view of a conventional semiconductor device of a two-layer wiring structure.

With recent increase in integration and functions of semiconductor devices, wirings have become increasingly finer, the number of wiring layers has increased, and the multi-layer wiring technique has become essential. FIG. 1 shows a cross-sectional view of a semiconductor device of a two-layer wiring structure formed using a conventional multi-layer wiring technique.

In FIG. 1, a first interlayer insulating film 12 is formed on a silicon substrate 10. On the first interlayer insulating film 12 is provided a lower layer metal wiring 14 made of aluminum or the like. The lower layer metal wiring 14 is covered with a fluorine-containing silicon oxide film 16. On the fluorine-containing silicon oxide film 16 is formed a TEOS-based silicon oxide film 18 (hereafter referred to as "TEOS film 18").

In semiconductor devices of the generation in which sub-quarter-micron wirings are used, especially in the ones for which high-speed operation is required, the capacitance of the interlayer insulating film must be sufficiently small. Since the fluorine-containing silicon oxide film 16 is more suitable for decrease in capacitance than a silicon oxide film that does not contain fluorine, the fluorine-containing silicon oxide film has been used as a part of the interlayer insulating film in such a semiconductor device.

On the TEOS film 18 is formed a metal wiring 20 made of aluminum or the like. The metal wiring 20 is covered with a silicon nitride film 22 that acts as a passivation film.

The method for manufacturing a conventional semiconductor device shown in FIG. 1 will be described below referring to FIGS. 2 to 4.

Figure 2:
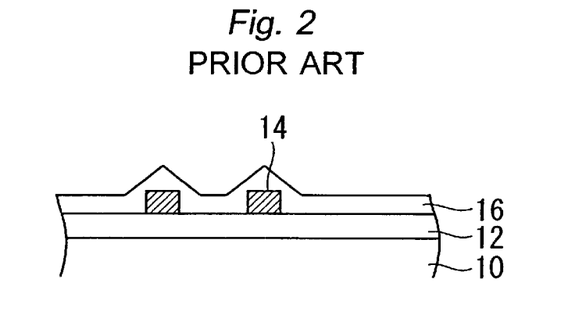
FIGS. 2 through 4 are cross-sectional views for describing a method for manufacturing the semiconductor devise shown in FIG. 1.

As shown in FIG. 2, a first interlayer insulating film 12, and a lower layer metal wiring 14 are first formed on a silicon substrate 10 using the combination of the CVD method, the etch-back method, the CMP method or the like.

A fluorine-containing silicon oxide layer 16 is deposited on the entire surface of the semiconductor wafer so as to cover the first interlayer insulating film 12 and the lower layer metal wiring 14. The fluorine-containing silicon oxide layer 16 is formed using the high-density plasma CVD method that uses $SiH_4$ gas, $O_2$ gas, and $C_2F_6$ gas as the reaction gases, that is, the CVD method to generate high-density plasma by impressing a bias voltage to the above-mentioned reaction gases. In such high-density plasma CVD method, deposition and sputter etching proceed simultaneously. Therefore, the portion having a step beneath it, that is, the portion above the lower layer metal wiring 14 has its corners etched off to have a triangular shape. The fluorine-containing silicon oxide layer 16 is deposited until the thickness thereof becomes substantially the same as that of the lower layer metal wiring 14.

Figure 3:
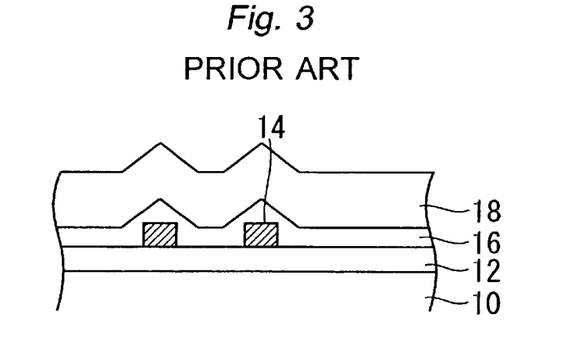

As shown in FIG. 3, a TEOS film 18 is deposited on the fluorine-containing silicon oxide layer 16. The TEOS film 18 is formed by, for example, the plasma CVD method that uses TEOS and $O_2$ gas as reaction gases. The underlying shapes are exactly reflected to the surface of a silicon oxide film formed by such CVD method. Therefore, the portion of the TEOS film 18 above the lower layer metal wiring 14 has a triangular shape.

Figure 4:
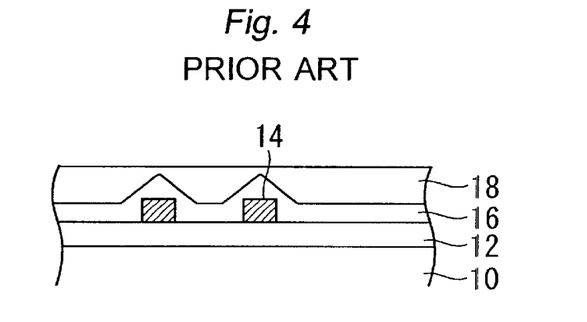

As shown in FIG. 4, the TEOS film 18 is planarized by the CMP method. This CMP method is performed so that the TEOS film 18 is left above the lower layer metal wiring 14, that is, so that the fluorine-containing silicon oxide layer 16 is not exposed on the surface of the TEOS film 18. Via holes (not shown) to the lower layer metal wiring 14 are formed in the fluorine-containing silicon oxide layer 16 and the TEOS film 18. In the via holes are formed tungsten plugs (not shown). The via holes and the tungsten plugs are formed using the combination of photoengraving, dry etching, sputtering, the CVD method, or the etch-back method.

Thereafter, a metal wiring 20 (see FIG. 1) is patterned on the TEOS film 18 so as to conduct to the above-described tungsten plugs, and a silicon nitride film 22 that acts as a passivation film is formed on the upper layer by the plasma CVD method. After a bonding pad section (not shown) is opened in the silicon nitride film 22, the semiconductor device having the multiple wiring structure shown in FIG. 1 is completed.

After the fluorine-containing silicon oxide layer 16 and the TEOS film 18 have been formed in the above-described conventional manufacturing method, the step of forming a tungsten film by the CVD method, the step of forming an aluminum film by sputtering, or the step of forming a silicon nitride film 22 by the plasma CVD method are performed. These steps are performed in high temperature atmospheres at about 400° C. Also in processes for manufacturing semiconductor devices, after the fluorine-containing silicon oxide layer 16 and the TEOS film 18 have been formed, heat treatment at a temperature of about 400° C. may be performed for stabilizing device characteristics.

Figure 5:
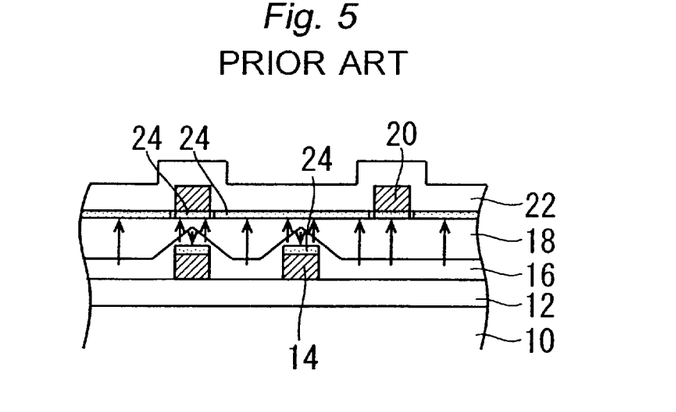
FIG. 5 is a cross-sectional view for describing a problem arising in the semiconductor device shown in FIG. 1.

Fluorine contained in the fluorine-containing silicon oxide layer 16 tends to diffuse during these heat treatments. The barrier effect of the TEOS film 18 against fluorine is low, while metal or the silicon nitride film 22 has a high barrier effect to prevent the diffusion of fluorine. Therefore, when the above-described heat treatments are performed, F layers 24 having a high fluorine concentration are formed in the vicinities of the upper surface of the lower layer metal wiring 14, the bottom surface of the metal wiring 20, and the bottom surface of the silicon nitride film 22, as shown in FIG. 5. These F layers 24 may cause film blistering, film separation, or pattern separation to occur.

In devices of the quarter-micron generation, a metal wiring having a structure in which AlCu is sandwiched between Ti-based films are normally used. In such a metal wiring, when, for example, a Ti/TiN film is used, an F layer 24 is formed in the vicinity of Ti. In this case, Ti reacts with F, resulting in the condition to cause film separation more easily.

The above-described film blistering, film separation, or pattern separation causes metal wiring to be short-circuited. Therefore, the conventional structures of semiconductor devices, and the methods for producing such semiconductor devices have had problems of disadvantages to easily cause the lowering of product yield and the deterioration of reliability.

SUMMARY OF THE INVENTION

The present invention has been devised to solve the above-described problems, and a first object of the present invention is to provide a semiconductor device that realizes high reliability and high product yield while using a fluorine-containing silicon oxide film as the interlayer insulation film.

The above object of the present invention is achieved by a semiconductor device having an interlayer oxide film formed of a fluorine-containing silicon oxide film. The device includes a metal wiring formed in an upper layer of the fluorine-containing silicon oxide film. The device further includes an $SiH_4$-based silicon oxide film existing only between the metal wiring and the fluorine-containing silicon oxide film.

The above object of the present invention is also achieved by a semiconductor device having an interlayer oxide film formed of a fluorine-containing silicon oxide film. The device includes a metal wiring formed in an upper layer of the fluorine-containing silicon oxide film. The device further includes a passivation film formed in the upper layer of the fluorine-containing silicon oxide film so as to cover the metal wiring. The passivation film comprises a low refraction factor silicon oxide film having a refraction factor lower than 1.48, and a silicon nitride film formed on the low refraction factor silicon oxide film.

The above object of the present invention is further achieved by a semiconductor device having an interlayer oxide film formed of a fluorine-containing silicon oxide film. The device includes a metal wiring formed in an upper layer of the fluorine-containing silicon oxide film. The metal wiring has a fluorination retardant metal layer that is difficult to react with fluorine at a bottom thereof.

Other objects and further features of the present invention will be apparent from the following detailed description when read in conjunction with the accompanying drawings.

DESCRIPTION OF THE PREFERRED EMBODIMENTS

The embodiments of the present invention will be described below referring to the drawings. The elements common to the drawings are represented by the same reference numerals, and duplicated description will be omitted.

First Embodiment

Figure 6:
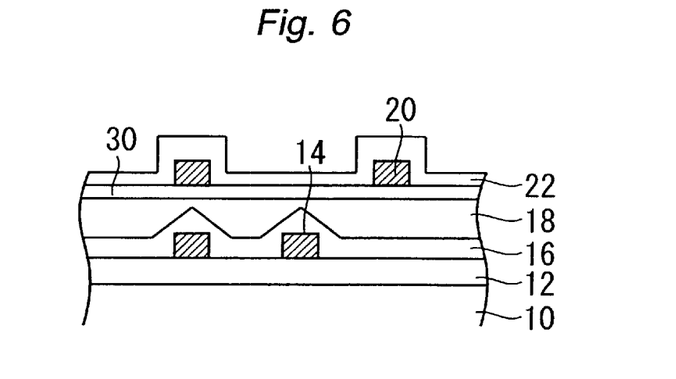
FIG. 6 is a cross-sectional view showing a major part of a semiconductor device according to a first embodiment of the present invention.

FIG. 6 is a cross-sectional view showing a semiconductor device according to a first embodiment of the present invention. As shown in FIG. 6, the semiconductor device of the first embodiment comprises a silicon substrate 10. On the silicon substrate 10 are formed a first interlayer insulating film 12 and lower layer metal wirings 14 by the combination of the CVD method, etch-back method, CMP method or the like.

On the first interlayer insulating film 12 is formed a fluorine-containing silicon oxide film 16 so as to cover the lower layer metal wirings 14. The fluorine-containing silicon oxide film 16 is a film that is deposited by the high-density plasma CVD method using $SiH_4$ gas, $O_2$ gas, and $C_2F_6$ gas as reaction gases. Since deposition and sputter etching proceed simultaneously in the above-described high-density plasma CVD method, the portion of the fluorine-containing silicon oxide film 16, under which the lower layer metal wiring 14 is present, has a triangular shape. The fluorine-containing silicon oxide film 16 is given substantially the same thickness as the lower layer metal wirings 14.

On the fluorine-containing silicon oxide film 16 is formed a TEOS film 18 by the plasma CVD method using TEOS and $O_2$ gas as reaction gases. The underlying shapes are exactly reflected to the surface of the film formed by such CVD method. Therefore, the TEOS film 18 is deposited so as to have a portion thereof which lies above the lower layer metal wirings 14 formed into a triangular shape (see FIG. 3). The TEOS film 18 thus deposited becomes the state shown in FIG. 6 when being planarized by the CMP method.

In the first embodiment, an $SiH_4$-based silicon oxide film 30 of a thickness of about 200 nm is formed on the planarized TEOS film 18. The $SiH_4$-based silicon oxide film 30 is a film formed by a plasma CVD method using $SiH_4$ and $O_2$ as reaction gases. The $SiH_4$-based silicon oxide film 30 contains more dangling bonds than the TEOS film 18, and has a structure to capture fluorine easily. The ratio of Si and O that compose the $SiH_4$-based silicon oxide film 30 can be changed by conditions such as the flow-rate ratio of $SiH_4$ gas and $O_2$ gas, reaction pressure, and RF power. In order to increase the number of dangling bonds effective for capturing fluorine, it is preferable that the Si content in the $SiH_4$-based silicon oxide film 30 is richer than the Si content in the stoichiometric composition. More specifically, a film having a refraction index n=1.5 to 1.6 (wavelength λ=632.8 nm) is preferably used as the $SiH_4$-based silicon oxide film 30.

Via holes (not shown) extending to the under layer metal wirings 14 are formed in the $SiH_4$-based silicon oxide film 30, the fluorine-containing silicon oxide film 16, and the TEOS film 18. In the via holes are formed tungsten plugs (not shown). The via holes and the tungsten plugs are formed by combining photoengraving, dry etching, sputtering, the CVD method, the etch-back method, and the like.

Metal wirings 20 are patterned on the SiH$_4$-based silicon oxide film 30 so as to conducting to the above-described tungsten plugs. Further on the metal wirings 20 is formed a silicon nitride film 22 functioning as a passivation film with the plasma CVD method. After opening a bonding pad section (not shown) in the silicon nitride film 22, the semiconductor device of the first embodiment is completed.

Fluorine contained in the fluorine-containing silicon oxide film 16 is diffused into the TEOS film 18 and the SiH$_4$-based silicon oxide film 30 by heat treatment at about 400° C. performed during the process for manufacturing the semiconductor device. Thus, the SiH$_4$-based silicon oxide film 30 can capture diffused fluorine adequately. Therefore, according to the semiconductor device of the first embodiment, the formation of films containing a high concentration of fluorine (corresponding to the F film 24 shown in FIG. 5) in the vicinity of the bottoms of metal wirings 20 and the bottom of silicon nitride film 22 can be prevented effectively. Therefore, according to the semiconductor device and the above-described manufacturing method of the first embodiment, the blistering and separation of films, or the separation of patterns caused by fluorine can be prevented, and excellent reliability and high product yield can be realized.

Second Embodiment

Next, a second embodiment of the present invention will be described below referring to FIGS. 7 and 8.

Figure 7:
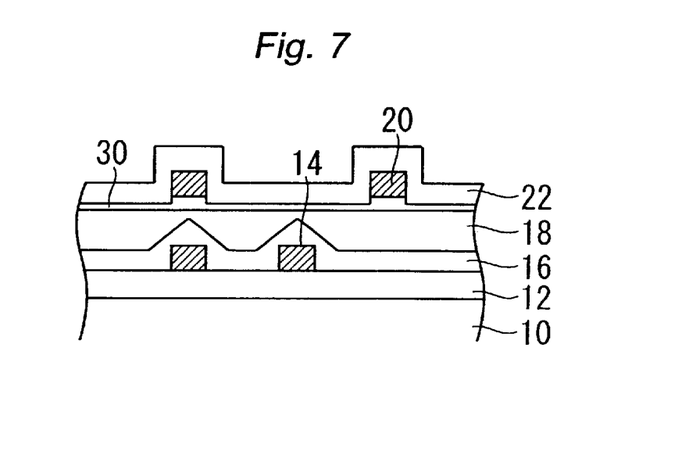
FIG. 7 is a diagram for illustrating problems involved in a manufacturing method employed in the first embodiment.

FIG. 7 is a diagram for illustrating problems involved in the above-described semiconductor device and manufacturing method of the first embodiment. In the first embodiment, the SiH$_4$-based silicon oxide film 30 is affected by over-etching for patterning the metal wirings 20. Therefore, the thickness of the SiH$_4$-based silicon oxide film 30, for example, of 100 nm may be thinned to 50 nm or less at the area not covered with metal wirings 20.

When the SiH$_4$-based silicon oxide film 30 has a sufficient thickness, even if the SiH$_4$-based silicon oxide film 30 captures fluorine diffused from the fluorine-containing silicon oxide film 16, the fluorine content in the film can be restricted within the allowable range. However, if the film thickness becomes excessively thin due to the effect of over-etching, the fluorine content in the SiH$_4$-based silicon oxide film 30 may exceed the allowable range when the film 30 captures fluorine diffused from the fluorine-containing silicon oxide film 16. Therefore, in the second embodiment, the semiconductor device is manufactured in the procedures described below to avoid such a problem.

Figure 8:
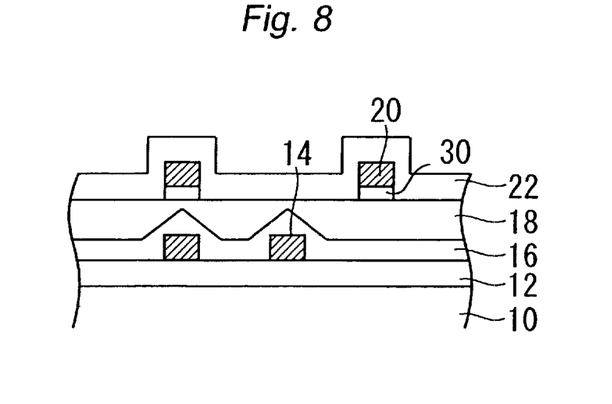
FIG. 8 is a cross-sectional view showing a major part of a semiconductor device according to a second embodiment of the present invention.

FIG. 8 is a cross-sectional view showing a semiconductor device manufactured by the method of the second embodiment. In the second embodiment, the SiH$_4$-based silicon oxide film 30 is deposited on the entire surface of the TEOS film 18 in the same procedures as in the first embodiment.

Next, a film of a metal, such as aluminum, is formed on the SiH$_4$-based silicon oxide film 30 using, for example, sputtering. In the procedure above, the semiconductor wafer is heated to about 400° C. Hereafter, this heat treatment is referred to as the "first heat treatment." The first heat treatment may be performed separately from the formation of the metal film.

The metal film is patterned by the combination of photoengraving and etching. As a result, metal wirings 20 are formed.

In the second embodiment, the SiH$_4$-based silicon oxide film 30 is next removed except the areas underneath the metal wirings 20. As a result, the SiH$_4$-based silicon oxide film 30 is patterned to the same patterns as the metal wirings 20 as shown in FIG. 8.

In the second embodiment, after the SiH$_4$-based silicon oxide film 30 is patterned as described above, a second heat treatment is performed. The second heat treatment is performed at a temperature of about 400° C. During the second heat treatment, fluorine that has been present in the area to be the base of the SiH$_4$-based silicon oxide film 30 is diffused again, and is captured by the SiH$_4$-based silicon oxide film 30. On the other hand, fluorine that has been present in the exposed area of the TEOS film 18 is diffused into the atmosphere.

When the above-described process steps have been completed, a silicon nitride film 22 is formed in the same procedures as in the first embodiment. In the second embodiment, the SiH$_4$-based silicon oxide film 30 is formed only underneath the metal wirings 20 as described above. Under the metal wirings 20, the thickness of the SiH$_4$-based silicon oxide film 30 is always maintained at a sufficient thickness. Therefore, in the second embodiment, the deterioration of the reliability of semiconductor devices and the lowering of product yield caused by the lack of thickness of the SiH$_4$-based silicon oxide film 30 can be prevented. Also in the second embodiment, since fluorine in the TEOS film 18 is diffused into the atmosphere, the formation of a layer having a high fluorine content in the vicinity of the boundary between the TEOS film 18 and the silicon oxide film 22 can be prevented. Therefore, according to the semiconductor device and the method for manufacturing the same of the second embodiment, a semiconductor device having excellent reliability and high product yield can be realized more stably than in First Embodiment.

Third Embodiment

Next, a third embodiment of the present invention will be described below referring to FIG. 9.

Figure 9:
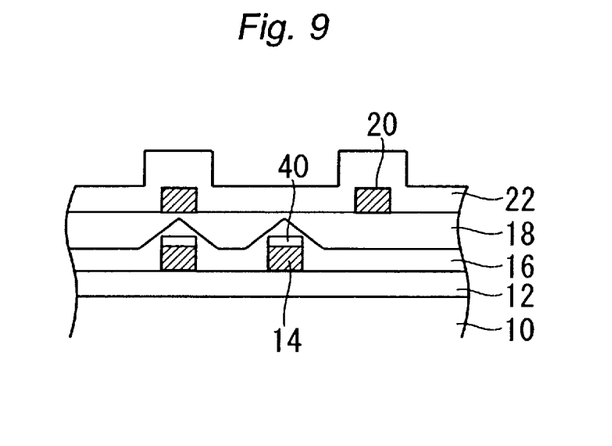
FIG. 9 is a cross-sectional view showing a major part of a semiconductor device according to a third embodiment of the present invention.

FIG. 9 is a cross-sectional view showing a semiconductor device according to the third embodiment. As shown in FIG. 9, the semiconductor device of the third embodiment comprises a fluorine-barrier film 40 formed on the lower layer metal wirings 14. The fluorine-barrier 40 is a film having characteristics to prevent the diffusion of fluorine, and is formed from an SiH$_4$-based silicon oxide film as used in the first embodiment or a silicon oxide-nitride film.

In the semiconductor devices of the first or second embodiment, fluorine contained in the fluorine-containing silicon oxide film 16 may gather in the vicinity of the upper surface of the lower layer metal wirings 14 during the heat treatment, and may form an F layer. In the third embodiment, since the fluorine-barrier film 40 is present on the lower layer metal wirings 14, it is ensured that the formation of such an F layer can be prevented. Therefore, according to the third embodiment, the blistering and separation of films in the vicinity of lower layer metal wirings 14 can be presented, and the semiconductor device having excellent reliability can be realized.

Fourth Embodiment

Next, Fourth Embodiment of the present invention will be described below referring to FIG. 10.

Figure 10:
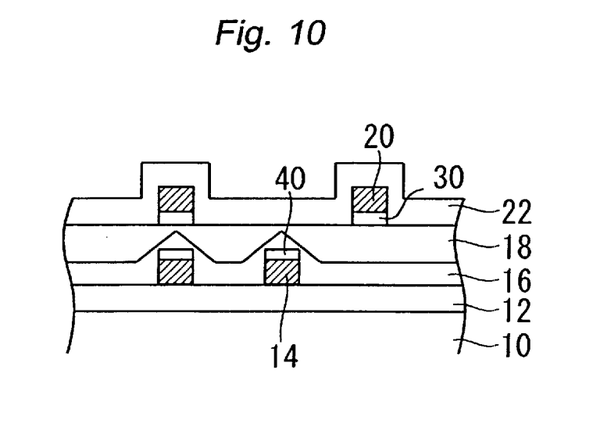
FIG. 10 is a cross-sectional view showing a major part of a semiconductor device according to a fourth embodiment of the present invention.

FIG. 10 is a cross-sectional view showing a semiconductor device according to a fourth embodiment. As shown in FIG. 10, the semiconductor device of the fourth embodiment comprises SiH$_4$-based silicon oxide films 30 that are present only underneath metal wirings 20, and fluorine-barrier films 40 that cover the upper surface of the lower metal wirings 14. In other words, the semiconductor device of the fourth embodiment is the combination of the above-described structures of the second embodiment and the the third Embodiment.

In the structure shown in FIG. 10, films for preventing the diffusion of fluorine are disposed between the fluorine-containing silicon oxide film 16 and the lower metal wirings 14, and between the TEOS film 18 and the metal wirings 20. Therefore, according to the fourth embodiment, further higher reliability than in the second or third embodiment can be realized.

Fifth Embodiment

Next, a fifth embodiment of the present invention will be described below referring to FIG. 11.

Figure 11:
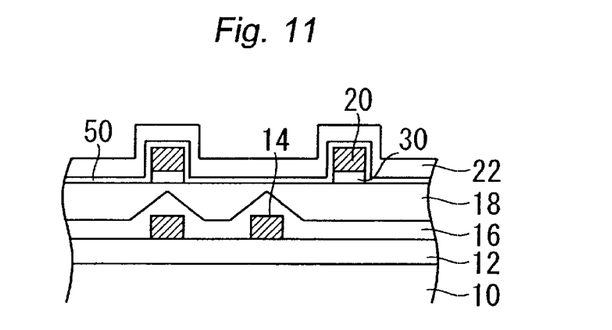
FIG. 11 is a cross-sectional view showing a major part of a semiconductor device according to a fifth embodiment of the present invention.

FIG. 11 is a cross-sectional view showing a semiconductor device according to the fifth embodiment. As shown in FIG. 11, the semiconductor device of the fifth embodiment comprises SiH$_4$-based silicon oxide films 30 that are present only underneath metal wirings 20, as in the semiconductor device of the third embodiment. The semiconductor device of the fifth embodiment also comprises a passivation film consisting of a silicon oxide film 50 and a silicon nitride film 22 on the TEOS film 18.

In the fifth embodiment, the TEOS film 18 is deposited on the fluorine-containing silicon oxide film 16, and then planarized by the CMP method as in the first to fourth Embodiments. Although the CMP method is performed under the conditions not to expose the fluorine-containing silicon oxide film 16, the portions of the fluorine-containing silicon oxide film 16 which have the triangular shapes are considered to be exposed on the surface of the TEOS film 18 when various conditions vary.

In this case, in the structures of the first to fourth embodiments, the fluorine-containing silicon oxide film 16 exposed on the surface of the TEOS film 18 may come into contact with the silicon nitride film 22 directly. Thereby, the fluorine content increases particularly at the contacting areas, easily causing the blistering or separation of films.

In the structure of the fifth embodiment, since the silicon oxide layer 50 is present underneath the passivation film even if the fluorine-containing silicon oxide film 16 is exposed on the surface of the TEOS film 18, the fluorine-containing silicon oxide film 16 does not come into contact with the silicon nitride film 22 directly. Therefore, with the semiconductor device of the fifth embodiment, further higher reliability and product yield than in the first to fourth embodiments can be realized.

In addition, in the fifth embodiment, the silicon oxide layer 50 that constitutes the lower layer of the passivation film is formed of a low-refraction-index silicon oxide film with a refraction index of lower than 1.48. The lower the refraction index, the higher the coverage characteristics of the silicon oxide layer 50. In the fifth embodiment, excellent coverage characteristics must be imparted to the silicon oxide layer 50 in order to achieve the object to prevent the direct contact between the fluorine-containing silicon oxide film 16 and the silicon nitride film 22.

Also, the better the coverage of the silicon oxide film 50 to be the lower layer of the passivation film, the better the coverage of the silicon nitride film 22 that becomes the upper layer of the passivation film. The passivation film is a film for protecting the semiconductor device. Therefore, good coverage characteristics are required for the passivation film. From this point of view, excellent coverage characteristics must be imparted to the silicon oxide film 50.

In the fifth embodiment, as described above, the silicon oxide film 50 is composed of a low-refraction-index film that has good coverage characteristics. Therefore, according to the fifth embodiment, the desired object to prevent the direct contact between the fluorine-containing silicon oxide film 16 and the silicon nitride film 22 can be achieved, and excellent coverage characteristics can be imparted to the passivation film.

Sixth Embodiment

Next, a method for manufacturing a semiconductor device according to a sixth embodiment of the present invention will be described referring to FIG. 12.

Figure 12:
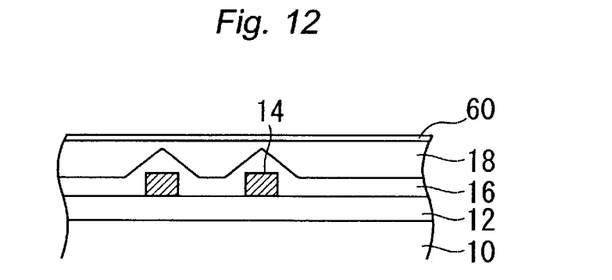
FIG. 12 is a diagram illustrating the major part of a method for manufacturing a semiconductor device according to a sixth embodiment of the present invention.

FIG. 12 is a diagram illustrating the major part of the method for manufacturing a semiconductor device of the sixth embodiment. In the manufacturing method of the sixth embodiment, a TEOS film 18 is formed on a fluorine-containing silicon oxide film 16 in the same procedures as the first embodiment.

On the TEOS film 18 planarized by the CMP method is formed a fluorine capturing film 60 of a predetermined thickness (e.g., 100 nm). The fluorine capturing film 60 is specifically composed of an SiH$_4$-based silicon oxide film formed by the plasma CVD method using SiH$_4$ and O$_2$ as reaction gases, or a silicon nitride film formed by the plasma CVD method using NH$_3$ gas as the reaction gas.

Next, in the sixth embodiment, a predetermined heat treatment is performed at a temperature exceeding 400° C. (e.g., 430° C.). By the above-described heat treatment, fluorine in the fluorine-containing silicon oxide film 16 is diffused, and is captured by the fluorine capturing film 60. At this time, since the fluorine capturing film 60 has a sufficient thickness (e.g., 100 nm), the separation of films does not occur.

Next, the fluorine capturing film 60 is removed by dry etching or wet etching. In this stage, fluorine captured in the fluorine capturing film 60 is also removed together with the fluorine capturing film 60.

After the fluorine capturing film 60 has been removed, metal wirings 20 and a silicon nitride film 22 are formed on the TEOS film 18 by the same procedures as conventional manufacturing methods (see FIG. 1). It is preferable that the temperature given to the semiconductor wafer after removing the fluorine capturing film 60 is 400° C. or below.

According to the above-described manufacturing method of the sixth embodiment, fluorine contained in the fluorine-containing silicon oxide film 16 is forcedly diffused by a heat treatment at a high temperature exceeding 400° C., and fluorine diffused through the upper surface of the TEOS film 18 is removed together with the fluorine capturing film 60. Therefore, even if a heat treatment at 400° C. or below is performed, the F layer containing an excessively high content of fluorine is not formed in the vicinities of the bottoms of the metal wirings 20 or the silicon nitride film 22. Therefore, according to the sixth embodiment, a semiconductor device having high reliability can be manufactured in high product yield.

Seventh Embodiment

Next, a method for manufacturing a semiconductor device according to a seventh embodiment of the present invention will be described referring to FIG. 13.

Figure 13:
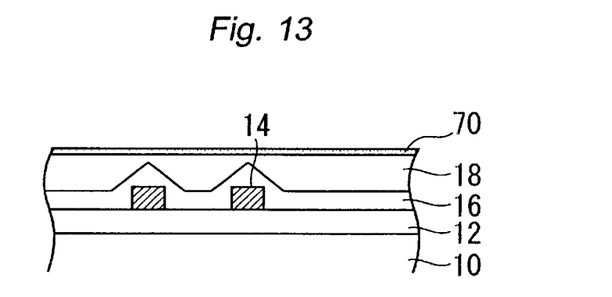
FIG. 13 is a diagram illustrating the major part of a method for manufacturing a semiconductor device according to a seventh embodiment of the present invention.

FIG. 13 is a diagram illustrating the major part of the method for manufacturing a semiconductor device of the seventh embodiment. In the manufacturing method of the seventh embodiment, a TEOS film 18 is formed on a fluorine-containing silicon oxide film 16 in the same procedures as the first embodiment.

On the TEOS film 18 planarized by the CMP method is formed a fluorine capturing film 70 of a predetermined thickness. The fluorine capturing film 70 in the seventh embodiment is composed of a Ti film formed, for example, by sputtering.

Next, a predetermined heat treatment is performed at a temperature exceeding 400° C. (e.g., 430° C.). By the above-described heat treatment, fluorine in the fluorine-containing silicon oxide film 16 is diffused to the vicinity of the bottom surface of the fluorine capturing film 70. As a result, Ti in the fluorine capturing film 70 reacts with F to form a TiF film.

Next, the fluorine capturing film 70 comprising the TiF film is removed by dry etching or wet etching. As a result, fluorine diffused through the upper surface of the TEOS film 18 is removed together with the fluorine capturing film 70.

After the fluorine capturing film 70 has been removed, metal wirings 20 and a silicon nitride film 22 are formed on the TEOS film 18 by the same procedures as conventional manufacturing methods (see FIG. 1). It is preferable that the temperature given to the semiconductor wafer after removing the fluorine capturing film 70 is 400° C. or below.

According to the above-described manufacturing method of the seventh embodiment, fluorine contained in the fluorine-containing silicon oxide film 16 is forcedly diffused by a heat treatment at a high temperature exceeding 400° C., and fluorine diffused through the upper surface of the TEOS film 18 is removed in the form of the TiF film. Therefore, even if a heat treatment at 400° C. or below is performed, the F layer containing an excessively high content of fluorine is not formed in the vicinities of the bottoms of the metal wirings 20 or the silicon nitride film 22. Therefore, according to the seventh embodiment, a semiconductor device having high reliability can be manufactured in high product yield.

Eighth Embodiment

Next, a method for manufacturing a semiconductor device according to an eighth embodiment of the present invention will be described referring to FIG. 14.

Figure 14:
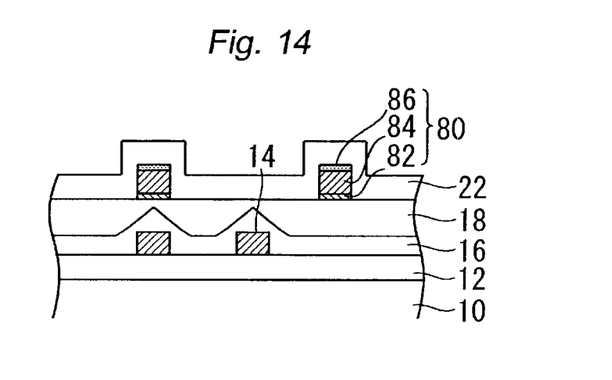
FIG. 14 is a diagram illustrating the major part of a method for manufacturing a semiconductor device according to a eighth embodiment of the present invention.

FIG. 14 is a cross-sectional view showing a semiconductor device of the eighth embodiment. Among the composing elements shown in FIG. 14, layers below the TEOS film 18 are formed by the same procedures as in the conventional manufacturing method (see FIGS. 2 to 4), the method of the sixth embodiment (see FIG. 12), or the method of the seventh embodiment (see FIG. 13).

In the eighth embodiment, metal wirings 80 of laminated structures are provided on the planarized TEOS film 18. Each of the metal wirings 80 has a fluorination-resistant metal film 82, i.e., a film 82 formed of a metal difficult to react with fluorine, at the lowermost layer. The fluorination-resistant metal film 82 is composed of a Ta film, a TaN film, or a laminated film thereof. On the fluorination-resistant metal film 82 are formed an AlCu film 84 and a TiN film 86.

In semiconductor devices to which the sub-quarter-micron design rule is applied, metal wirings formed of an aluminum-based metal sandwiched with a Ti-based metal are generally used. However, when such metal wirings are used in combination with a fluorine-containing silicon oxide film, the Ti-based metal, which should function as a barrier metal, reacts with fluorine, often causing defects such as the separation of films.

In the eighth embodiment, the bottom surfaces of the metal wirings 80, i.e., the surface that contacts with fluorine diffused through the TEOS film 18 is composed of the fluorination-resistant metal film 82. Consequently, the bottom surfaces of the metal wirings 80 do not react with fluorine, and defects such as the separation of films can be prevented effectively. Therefore, according to the eighth embodiment, further higher reliability and product yield of semiconductor devices than in the sixth or seventh embodiment can be realized.

Ninth Embodiment

Next, Ninth Embodiment of the present invention will be described below referring to FIG. 15.

Figure 15:
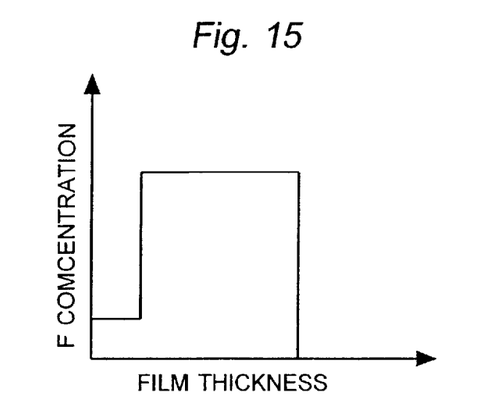
FIG. 15 is a diagram showing a distribution of fluorine concentrations employed in a ninth embodiment of the present invention.

FIG. 15 is a diagram showing the distribution of fluorine concentrations in the fluorine-containing silicon oxide film 16 of the ninth embodiment. The semiconductor device of the ninth embodiment is realized by combining the fluorine concentration distribution shown in FIG. 15 with a semiconductor device manufactured by any of above-described methods in the first to eighth embodiments, or a semiconductor device manufactured by conventional manufacturing methods.

In FIG. 15, the abscissa indicates the locations in the film thickness direction. As shown in FIG. 15, in the ninth embodiment, the fluorine-containing silicon oxide film 16 has low fluorine concentration in the region where the locations in the film thickness direction are small, but high fluorine concentration in the region where the locations in the film thickness direction are large. In other words, the fluorine-containing silicon oxide film 16 of the ninth embodiment has low fluorine concentration in the vicinity of the lower layer metal wirings 14, and high fluorine concentration in the region away from the lower layer metal wirings 14.

The fluorine-containing silicon oxide film 16 having the above-described fluorine concentration distribution can be formed in the step of forming the fluorine-containing silicon oxide film 16 using the plasma CVD method, by performing CVD first under the condition of low fluorine concentration, and then under the condition of high fluorine concentration.

In the semiconductor device of the ninth embodiment, since the fluorine concentrations in the fluorine-containing silicon oxide film 16 have the distribution as described above, the fluorine concentration can be lowered in the vicinity of the lower layer metal wirings 14, compared with the case where the fluorine concentration in the fluorine-containing silicon oxide film 16 is uniform. Therefore, in the semiconductor device of the ninth embodiment, the occurrence of film separation in the vicinity of the lower layer metal wirings 14 can be prevented effectively while controlling the capacitance of the interlayer insulating film.

Tenth Embodiment

Next, the tenth embodiment of the present invention will be described below referring to FIGS. 16A and 16B.

Figure 16A:
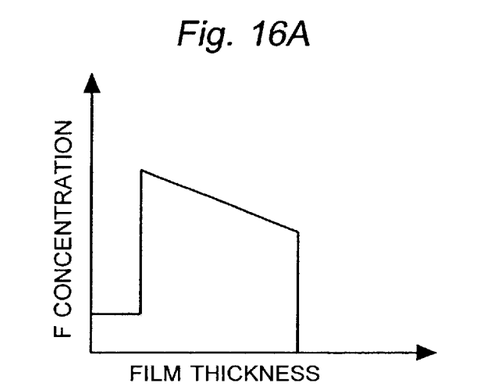
FIGS. 16A and 16B are diagrams showing a distribution of fluorine concentrations employed in a tenth embodiment of the present invention.

FIG. 16A is a diagram showing an example of the distribution of fluorine concentrations in the fluorine-containing silicon oxide film 16 of the tenth embodiment. FIG. 16B is a diagram showing another example of the distribution of fluorine concentrations in the fluorine-containing silicon oxide film 16 of the tenth embodiment. The semiconductor device of the nenth embodiment is realized by combining the fluorine concentration distribution shown in FIG. 16A or FIG. 16B with a semiconductor device manufactured by any of above-described methods in the first to eighth embodiments, or a semiconductor device manufactured by conventional manufacturing methods.

Figure 16B:
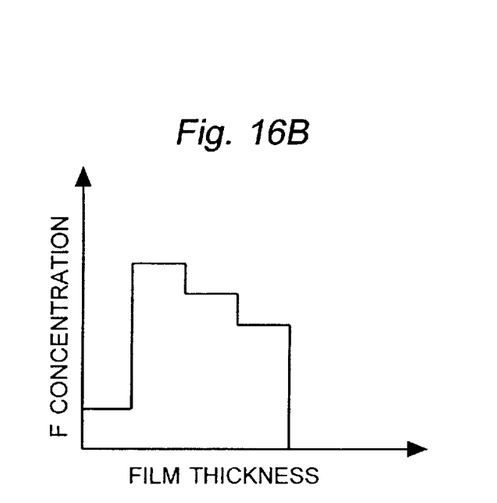

In FIGS. 16A and 16B, the abscissas indicate the locations in the film thickness direction. As FIGS. 16A and 16B show, in the tenth embodiment, the fluorine-containing silicon oxide film 16 has low fluorine concentration in the first region close to the lower layer metal wirings 14, and high fluorine concentration in the second region away from the lower layer metal wirings 14. Furthermore, the fluorine concentration in the second region is adjusted to become lower at locations in the film thickness direction are larger, that is closer to the TEOS film 18.

The fluorine-containing silicon oxide film 16 having the above-described fluorine concentration distribution can be formed in the step of forming the fluorine-containing silicon oxide film 16 using the plasma CVD method, by performing CVD first under the condition of low fluorine concentration, and then under the condition of high fluorine concentration continuously or stepwise lowering the fluorine concentration.

According to the semiconductor device of the tenth embodiment, the fluorine concentration in the vicinity of the lower layer metal wirings 14 can be lowered, and the concentration of fluorine that reaches the metal wirings 20 passing through the TEOS film 18 can also be lowered. Therefore, according to the semiconductor device of the tenth embodiment, film separation in the vicinity of the lower layer metal wirings 14, and film separation in the vicinity of the wirings 20 can be prevented effectively while controlling the capacitance of the interlayer insulating film.

Since the present invention is constituted as described above, the following effects can be exerted.

According to a first aspect of the present invention, the $SiH_4$-based silicon oxide films are disposed only underneath the metal wirings. In this case, fluorine contained in the fluorine-containing silicon oxide film can be diffused from the areas not covered with the metal wirings to the atmosphere. Therefore, according to the present invention, the formation of the F layer containing an excessively high concentration of fluorine can be prevented, and the reliability and the product yield of semiconductor devices can be improved.

According to a second aspect of the present invention, fluorine diffused onto the lower layer metal wirings can be captured with the $SiH_4$-based silicon oxide films. Therefore, according to the present invention, the separation of films in the vicinity of the lower layer metal wirings can be prevented effectively.

According to a third aspect of the present invention, fluorine diffused onto the lower layer metal wirings can be captured with the silicon nitride films. Therefore, according to the present invention, the separation of films in the vicinity of the lower layer metal wirings can be prevented effectively.

According to a fourth aspect of the present invention, since the passivation film contains a silicon oxide film, the direct contact between the fluorine-containing silicon oxide film and the silicon nitride film can be prevented.

According to a fifth aspect of the present invention, the silicon oxide film included in the passivation film is composed of a film of low refraction index. In this case, since the silicon oxide film has good coverage characteristics, the reliability of the passivation film can be improved while surely achieving the desired object of preventing the direct contact between the fluorine-containing silicon oxide film and the silicon nitride film.

According to a sixth aspect of the present invention, since the fluorination resistant metal film (Ta or TaN) is formed on the bottom surfaces of the metal wirings, even if fluorine is diffused to the bottom surfaces of the metal wirings, film separation in the vicinity of the bottom surfaces thereof can be prevented.

According to a seventh aspect of the present invention, fluorine diffused from the fluorine-containing silicon oxide film can be captured in the fluorine capturing film, and can be removed together with the fluorine capturing film. Therefore, according to the present invention, film separation or the like can be prevented effectively, and the reliability and product yield of semiconductor devices can be improved.

Further, the present invention is not limited to these embodiments, but variations and modifications maybe made without departing from the scope of the present invention.

The entire disclosure of Japanese Patent Application No. 2001-51172 filed on Feb. 26, 2001 including specification, claims, drawings and summary are incorporated herein by reference in its entirety.

What is claimed is:

1. A semiconductor device having an interlayer oxide film formed of a fluorine-containing silicon oxide film, comprising:

a metal wiring formed over said fluorine-containing silicon oxide film; and a $SiH_4$-based silicon oxide film formed only between said metal wiring and said fluorine-containing silicon oxide film, wherein said metal wiring is formed on and contacting said $SiH_4$-based silicon oxide film.

2. The semiconductor device according to claim 1, further comprising:

a lower-layer metal wiring formed under said fluorine-containing silicon oxide film; and a second $SiH_4$-based silicon oxide film formed between said lower-layer metal wiring and said fluorine-containing silicon oxide film.

3. The semiconductor device according to claim 1, further comprising:

a lower-layer metal wiring formed under said fluorine-containing silicon oxide film; and a silicon oxide-nitride film formed between said lower-layer metal wiring and said fluorine-containing silicon oxide film.

4. The semiconductor device according to claim 1, further comprising:

a passivation film formed over said fluorine-containing silicon oxide film so as to cover said metal wiring, wherein said passivation film comprises a silicon oxide film, and a silicon nitride formed on said silicon oxide film.

5. A semiconductor device having an interlayer oxide film formed of a fluorine-containing silicon oxide film, comprising:

a metal wiring formed over said fluorine-containing silicon oxide film;

a $SiH_4$-based silicon oxide film formed only between said metal wiring and said fluorine-containing silicon oxide film; and a passivation film formed on said fluorine-containing silicon oxide film so as to cover said metal wiring, wherein said passivation film comprises a low refraction factor silicon oxide film having a refraction factor lower than 1.48, and a silicon nitride film formed on said low refraction factor silicon oxide film.

* * * * *